United States Patent
Son et al.

(10) Patent No.: US 6,383,876 B1
(45) Date of Patent: May 7, 2002

(54) MOS DEVICE HAVING NON-UNIFORM DOPANT CONCENTRATION AND METHOD FOR FABRICATING THE SAME

(75) Inventors: Jeong Hwan Son, Taejeon; Ki Jae Huh, Chungcheongbuk-do, both of (KR)

(73) Assignee: LG Semicon Co., Ltd., Chungcheongbuk-Do (KR)

( * ) Notice: Subject to any disclaimer, the term of this patent is extended or adjusted under 35 U.S.C. 154(b) by 0 days.

(21) Appl. No.: 09/627,298

(22) Filed: Jul. 27, 2000

Related U.S. Application Data

(62) Division of application No. 09/069,867, filed on Apr. 30, 1998, now Pat. No. 6,137,141.

(30) Foreign Application Priority Data

May 6, 1997 (KR) ............................................. 97/17320

(51) Int. Cl.[7] ............................................. H01L 21/336
(52) U.S. Cl. ...................... 438/289; 438/290; 438/291; 438/303; 438/585; 438/595
(58) Field of Search ................................. 438/289, 290, 438/291, 303, 305, 585, 595

(56) References Cited

U.S. PATENT DOCUMENTS

| | | | | |
|---|---|---|---|---|
| 5,166,765 A | | 11/1992 | Lee et al. ..................... 257/345 |
| 5,448,094 A | | 9/1995 | Hsu ............................. 257/330 |
| 5,449,937 A | | 9/1995 | Arimura et al. ............. 257/345 |
| 5,489,543 A | * | 2/1996 | Hong .......................... 438/291 |
| 5,512,770 A | | 4/1996 | Hong .......................... 257/345 |
| 5,677,218 A | * | 10/1997 | Tseng .......................... 438/291 |
| 5,698,461 A | * | 12/1997 | Liu ............................. 438/291 |
| 5,773,348 A | * | 6/1998 | Wu ............................. 438/305 |
| 5,879,998 A | * | 3/1999 | Krivokapic .................. 438/300 |
| 5,895,954 A | | 4/1999 | Yasumura et al. ........... 257/345 |
| 5,929,495 A | | 7/1999 | Dennison et al. ........... 257/402 |
| 6,025,232 A | * | 2/2000 | Wu et al. ..................... 438/270 |
| 6,074,920 A | * | 6/2000 | Houston ...................... 438/289 |
| 6,100,142 A | * | 8/2000 | Liao ............................. 438/291 |

* cited by examiner

Primary Examiner—Carl Whitehead, Jr.
Assistant Examiner—Toniae M. Thomas
(74) Attorney, Agent, or Firm—Morgan, Lewis & Bockius LLP

(57) ABSTRACT

A metal-oxide-semiconductor (MOS) device in which the nonuniform dopant concentration in the channel region is obtained by means of ion implantation through a polysilicon gate electrode of nonuniform cross section, which is itself obtained by oxidizing the polysilicon using a semirecessed LOCOS process. The present invention is directed most generally to a semiconductor device which includes: a semiconductor substrate of a first conductivity type; a gate insulator on the substrate, the gate insulator sharing an interface with the substrate; a gate electrode on the gate insulator, the gate electrode having a first side, a second side, and a middle region between the first and second sides; a source doped region of a second conductivity type within the substrate to the first side of the gate electrode and a drain doped region of the second conductivity type within the substrate to the second side of the gate electrode, the source and drain doped regions self-aligned to the gate electrode; and a channel doped region of the first conductivity type within the substrate below the gate electrode, the channel doped region having a peak dopant concentration profile such that the peak dopant concentration under the middle region of the gate electrode occurs further below the gate insulator-substrate interface than does either the peak dopant concentration under the first side of the gate electrode or the peak dopant concentration under the second side of the gate electrode.

3 Claims, 9 Drawing Sheets

MOS DEVICE HAVING NON-UNIFORM DOPANT CONCENTRATION AND METHOD FOR FABRICATING THE SAME

This is a divisional of application(s) application Ser. No. 09/069,867 filed on Apr. 30, 1998 now U.S. Pat. No. 6,137,141.

BACKGROUND OF THE INVENTION

1. Field of the Invention

The present invention relates to a metal-oxide-semiconductor (MOS) device and, more particularly, to a MOS device in which the dopant concentration in the channel region is nonuniform and also to a method for fabricating the device.

2. Discussion of the Related Art

Although lightly doped substrates generally produce optimum device behavior in long-channel MOS devices, higher substrate doping is required to overcome the detrimental short-channel effects that accompany a reduction of channel length. Increases in substrate dopant concentration, however give rise to larger junction capacitances, lower junction breakdown voltages, and lower carrier mobilities, making such increases in substrate dopant concentration undesirable. Trade-offs must thus be made in selecting the proper substrate dopant concentration to achieve optimum device performance in short-channel MOS devices.

Varying the concentration of dopants in the channel region of an MOS device, the region within the substrate that separates the source and drain regions of the device, has been proposed as one way of mitigating the adverse effects on threshold voltage and subthreshold currents of a reduction of MOS gate length. Nonuniform dopant concentrations in the channel region are usually realized by ion implantation The dependence of dopant concentration on depth achieved by means of ion implantation is often modeled by a Gaussian distribution whose mean is the projected range of the beam (ie., the mean penetration depth of the implanted species along the implantation direction) and whose standard deviation is the projected straggle of the beam (i.e.,the square root of the mean squared deviation of the penetration depth along the implantation direction about the mean penetration depth along the implantation direction). The nonuniformity of dopant concentration over any cross section of the substrate may be described by lines of equal dopant concentration and, when the projected straggle of the beam is small compared to the projected range of the beam, by the line of peak dopant concentration or peak dopant concentration profile, often called simply the doping profile. Two well-known, nonuniform channel doping profiles that have been employed in short-channel MOS devices are the halo-shaped profile and the pulse-shaped profile.

FIG. 1a is an idealized cross-sectional view of an short-channel NMOS device whose channel region has a halo-shaped doping profile. The channel region adjacent to those parts of the lightly doped n-type source/drain regions nearest the gate electrode has been implanted with p-type dopants. Heavily doped p-type edge portions 15a thus separate lightly doped n-type source/drain regions 16 and the tightly doped p-type channel region under the gate electrode. (Adjacent and contiguous both denote being in close proximity. Adjacent may or may not imply contact, but always implies absence of anything of the same kind in between, while contiguous implies having contact on all or most of one side.)

A short-channel MOS device whose channel region has a halo-shaped doping profile thus includes: a gate oxide 11 on a lightly doped semiconductor substrate 10 of a first conductivity type; a gate electrode 12 on the gate oxide; insulating gate sidewall spacers 17 on the gate oxide contiguous to either side of the gate electrode; lightly doped source/drain regions 16 of a second conductivity type within the substrate to either side of the gate electrode, self-aligned to the gate electrode; heavily doped source/drain regions 18 of the second conductivity type within the substrate to either side of the gate electrode, self-aligned to the sidewall spacers contiguous to the gate electrode; and heavily doped halo-shaped regions 15a of the first conductivity type adjacent to the lightly doped source/drain regions 16 of the second conductivity type nearest the gate electrode. More generally, the halo regions may bound from below only the lightly doped source/drain regions or may bound from below both the lightly doped and the heavily doped source/drain regions. In other words, the halo region under some portion of the interface may lie below all parts of the lightly doped source/drain region under that portion of the interface, or the halo region under some portion of the interface may lie below all parts of both the lightly doped and the heavily doped source/drain regions under that portion of the interface.

The halo-shaped doping profile may be formed immediately after the gate electrode has been deposited on the gate oxide by implanting dopants of the first conductivity type with a shallow wafer tilt angle. Alternatively, the halo-shaped doping profile may be formed immediately after the gate sidewall spacers have been formed by implanting dopants of the first conductivity type with a steeper wafer tilt angle. B or $BF_2$ are typically implanted to form a halo-shaped doping profile in an NMOS device, while As or P are typically implanted to form a halo-shaped doping profile in a PMOS device.

FIG. 1b is an idealized cross-sectional view of a short channel NMOS device whose channel region has a pulse-shaped doping profile, a region sometimes referred to as a super-steep retrograde doped channel. The doped channel region may thus be divided into an upper, lightly-doped portion, which is close to the gate oxide, and a lower, heavily-doped portion 15b, which is further from the gate oxide and is separated from the gate oxide by the upper, lightly-doped portion.

A short-channel MOS device whose channel region has a pulse-shaped doping profile thus includes: a gate oxide 11 on a lightly doped semiconductor substrate 10 of a first conductivity type; a gate electrode 12 on the gate oxide; insulating gate sidewall spacers 17 on the gate oxide contiguous to either side of the gate electrode; lightly doped source/drain regions 16 of a second conductivity type within the substrate to either side of the gate electrode, self-aligned to the gate electrode; heavily doped source/drain regions 18 of the second conductivity type within the substrate to either side of the gate electrode, self-aligned to the sidewall spacers contiguous to the gate electrode; a heavily doped pulse-shaped region 15b of the first conductivity type at about the same depth as the bottom of the source/drain regions; and a lightly doped region 19 of the first conductivity type between heavily doped region 15b and gate oxide 11.

A channel region with a pulse-shaped doping profile topped by a uniformly lightly-doped region may be formed either by implantation of heavy ions, typically Sb or As for a PMOS device or in for an NMOS device, into a uniformly lightly-doped region or by implantation into an undoped substrate followed by epitaxial growth of the uniformly lightly doped region. The heavily-doped region deep within the channel region affects the distant gate oxide-substrate interface by increasing the magnitude of the threshold voltage of the device. The lightly doped region is formed between the heavily doped region and the oxide-substrate interface in order to keep the threshold voltage from changing.

Although either a halo-shaped or a pulse-shaped channel doping profile does mitigate some of the short-channel effects that degrade device performance, neither profile mitigates all adverse short-channel effects and each profile creates additional problems. A halo-shaped channel doping profile effectively keeps the total width of the source and drain depletion regions smaller than the channel length, thereby suppressing subthreshold currents in both the bulk substrate (i.e., punchthrough) and at the gate oxide-substrate interface (i.e., current caused by drain-induced barrier lowering) in a short channel device. The heavily-doped edges that border the source/drain regions when the channel region has a halo-shaped doping profile increase the resistance to majority carrier current flow from source to drain. More importantly, a halo-shaped channel doping profile significantly increases source-to-body and drain-to-body capacitance, thereby decreasing the switching speed of MOS digital circuits. Although a pulse-shaped channel doping profile reduces the lateral widening of the drain depletion region below the gate oxide-substrate interface, it also increases both source-to-body and drain-to-body capacitance (though much less than the halo-shaped doping profile) and increases the magnitude of the source-substrate bias, which increases the magnitude of the threshhold voltage required to achieve inversion. A halo-shaped channel doping profile also has an adverse effect on the threshold voltage of a MOSFET in that the threshold voltage varies with the uniformity of the tilted ion implant, which is difficult to control.

SUMMARY OF THE INVENTION

The present invention is directed most generally to a semiconductor device which includes: a semiconductor substrate of a first conductivity type; a gate insulator on the substrate, the gate insulator sharing an interface with the substrate; a gate electrode on the gate insulator, the gate electrode having a first side, a second side, and a middle region between the first and second sides; a source doped region of a second conductivity type within the substrate to the first side of the gate electrode and a drain doped region of the second conductivity type within the substrate to the second side of the gate electrode; and a channel doped region of the first conductivity type within the substrate between the source and drain doped regions, the channel doped region having a first channel depth under the first side of the gate electrode, a second channel depth under the second side of the gate electrode, and a channel bottom depth under the middle region of the gate electrode greater in magnitude than both the first channel depth and the second channel depth.

DETAILED DESCRIPTION OF THE PREFERRED EMBODIMENTS

First Embodiment

Figure 1A:
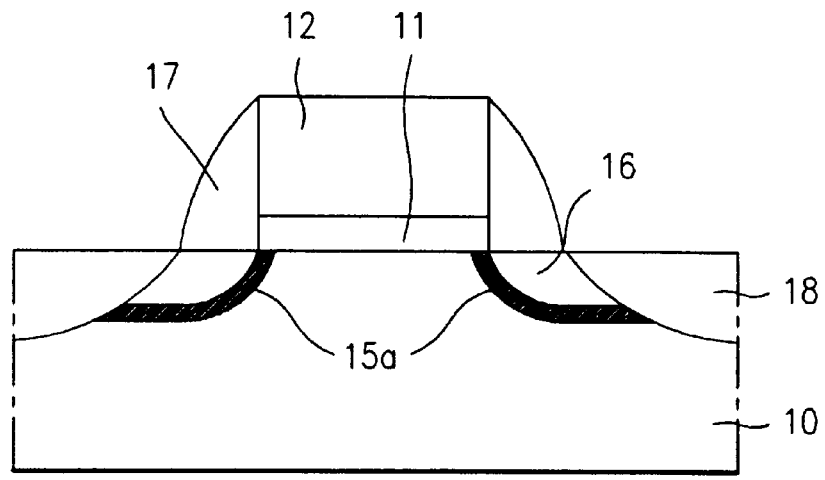
FIGS. 1a and 1b are idealized cross-sectional views of short-channel NMOS devices disclosed in the prior art whose channel regions have nonuniform doping profiles.
Figure 1B:
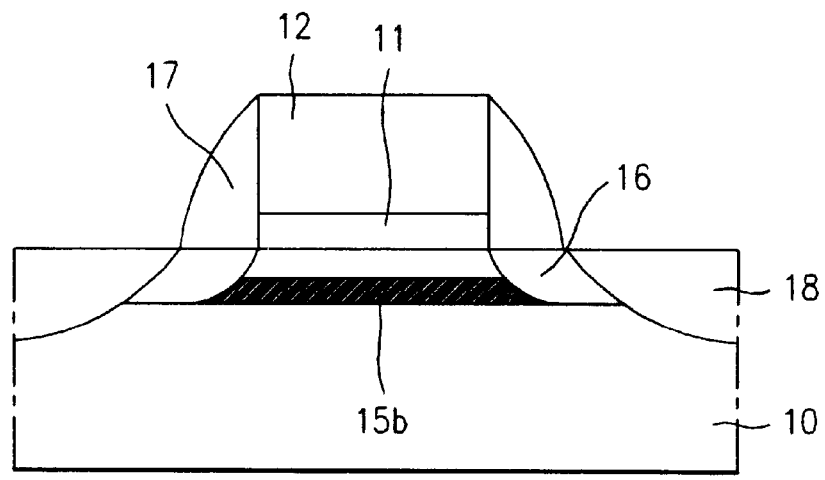
Figure 2A:
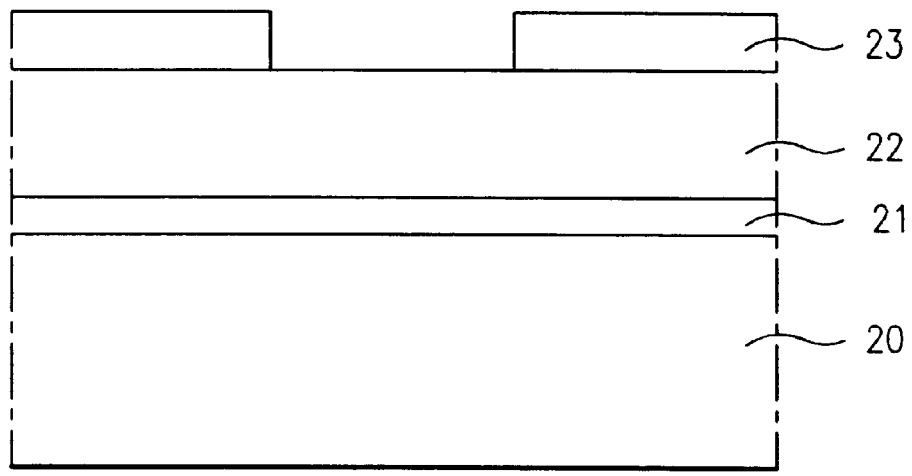
FIGS. 2a–2j are idealized cross-sectional views illustrating process steps of a method of fabricating a short-channel NMOS device according to a first embodiment of the present invention.

As shown in FIG. 2a, a polysilicon layer 22 of approximate thickness 1500–2500 Å is deposited over a gate oxide layer 21 that has been thermally grown to an approximate thickness 40–100 Å on a lightly-doped silicon substrate 20 of a first conductivity type. A silicon nitride layer 23 of approximate thickness 500–2000 Å is formed on the polysilicon layer 22 and then patterned by means of conventional photolithographic and etching processes to expose a strip of the polysilicon layer 22 that will subsequently become the gate electrode 22a.

Figure 2B:
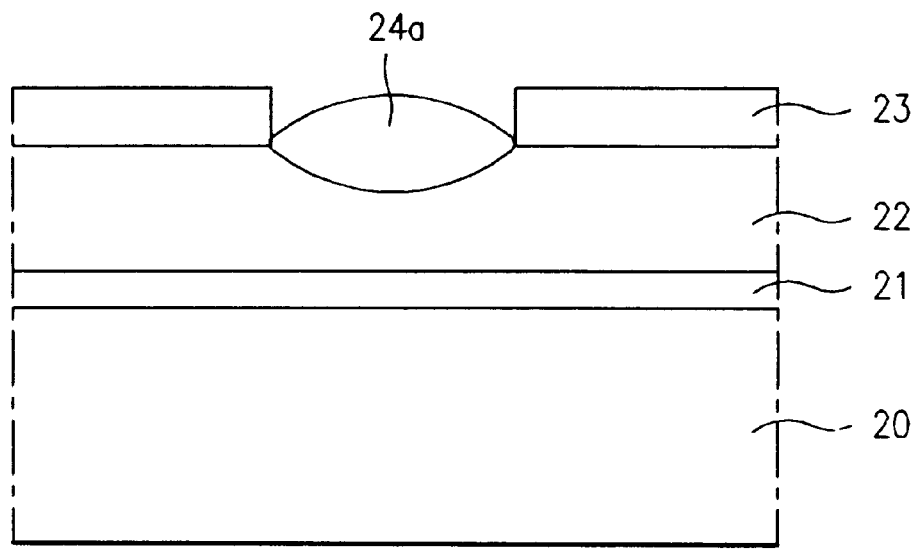

The exposed strip of polysilicon layer 22 is oxidized to form an oxide strip 24a above what will subsequently become the gate electrode, as shown in FIG. 2b.

Figure 2C:
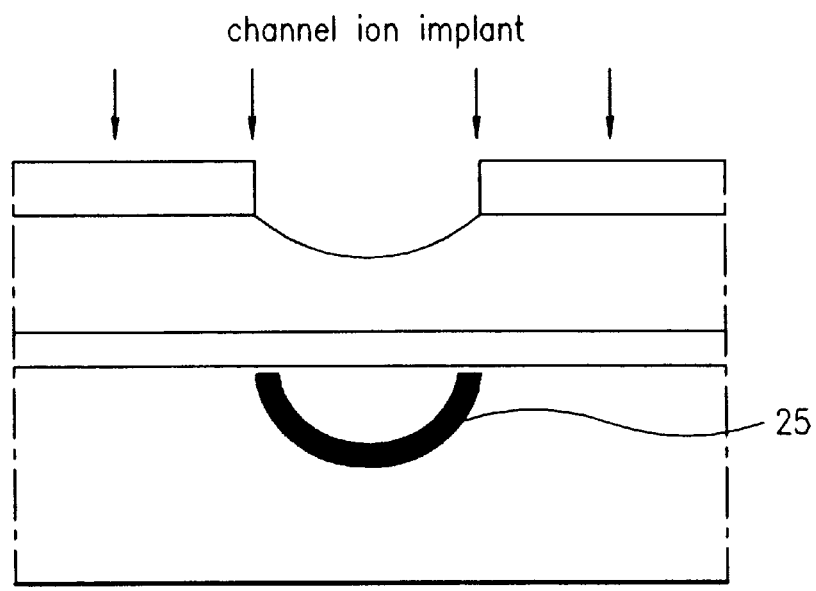

When the oxide strip 24a is removed from the polysilicon layer 22, the resulting exposed surface of the polysilicon layer has a depression characteristic of a silicon substrate that has been oxidized by means of a semirecessed LOCOS process, as shown in FIG. 2c. Although the curvature of a silicon surface that has been oxidized in this manner is evident only near the margins of the surface, the neighborhood of the sides of the gate here comprises a significant fraction of the gate due to the (short-channel) geometry of the device being fabricated. This departure from planarity caused by the use of semirecessed LOCOS oxidation, normally a limitation of the process when applied to the fabrication of submicron devices, is used to advantage in the following process step.

A heavily doped channel region 25 of the first conductivity type is formed within the substrate by ion implantation masked by what will become the polysilicon gate 22a. Due to the lateral variation in thickness of this part of the polysilicon layer, the depth below the gate oxide-substrate interface of the peak dopant concentration in what will subsequently become the channel region also varies laterally. Under the (relatively thick) sides of what will subsequently become the gate electrode, close to what will subsequently become the lightly doped source/drain regions, the peak dopant concentration occurs closest to the gate oxide-substrate interface, typically at depths comparable to the depths of what will become the source/drain junctions. Under the (relatively thin) middle region of what will become the gate electrode, separating what will subsequently become the heavily doped source/drain regions, the peak dopant concentration occurs furthest from the gate oxide-substrate interface, typically at a depth comparable to the depths of the bottoms of what will subsequently become the heavily doped source/drain regions.

The doping profile of the channel region obtained by ion implantation through the gate electrode thus reflects the lateral variation in thickness across the gate electrode. The peak dopant concentration under the middle region of the gate electrode occurs further below the gate oxide-substrate interface than the peak dopant concentration under the sides of the gate electrode. For a long-channel MOS device, the peak dopant concentration profile approximates the pulse-shaped doping profile described in the above Discussion of Related Art. As the gate length is reduced, the sides of the gate electrode assume greater importance in determining the doping profile until the peak dopant concentration finally exhibits a concave-up profile, in which the depth of the peak dopant concentration below the gate oxide-substrate interface varies continuously from its relative minima under the sides of the gate electrode to its maximum under the middle region of the gate electrode.

The doping of the channel region is completed by formation of uniformly lightly doped channel region 29 of the first conductivity type above heavily doped channel region 25 by means of ion implantation.

Figure 2D:
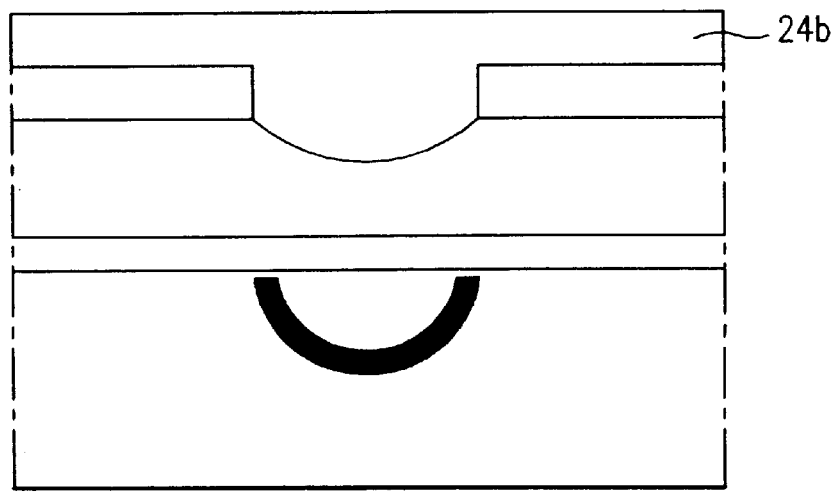

As shown in FIG. 2d, an oxide layer 24b is formed on the nitride layer 23 and on the exposed surface of the polysilicon layer 22 until a planar surface has been formed.

Figure 2E:
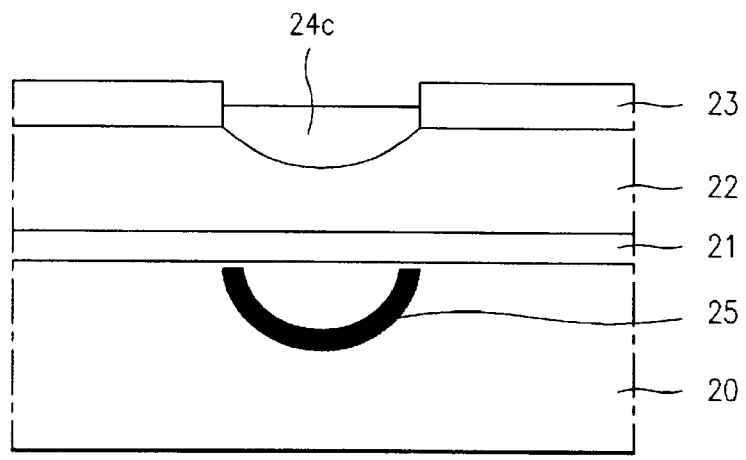

As shown in FIG. 2e, the oxide layer 24b is etched-back until the only remaining exposed oxide is an oxide strip 24c over what will become the polysilicon gate electrode 22a.

Figure 2F:
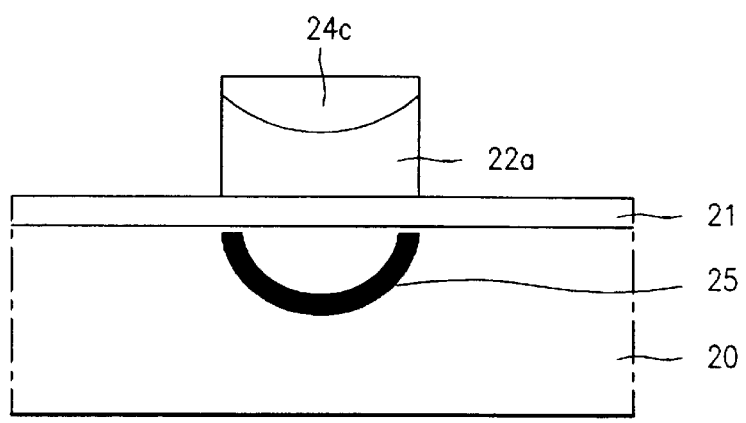

As shown in FIG. 2f the nitride layer 23 and the polysilicon layer 22 are anisotropically etched to expose portions of the gate oxide layer 21 and to form polysilicon a gate electrode 22a topped by a thinned oxide strip 24c.

Figure 2G:
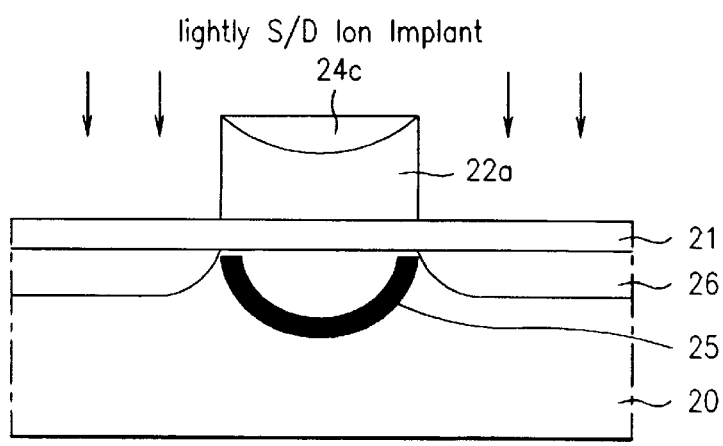
Figure 2H:
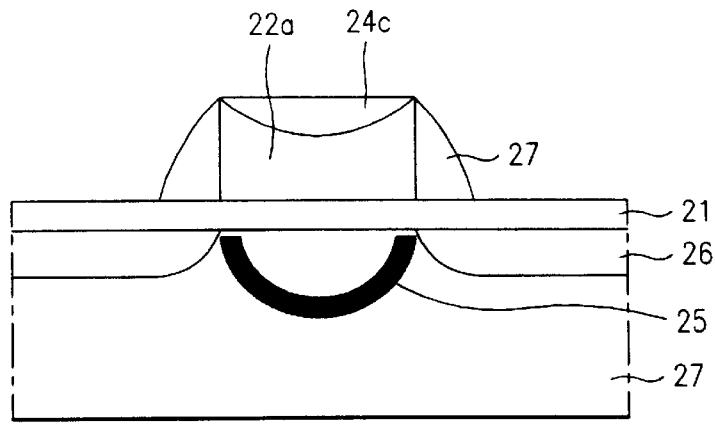

As shown in FIG. 2g, dopants are implanted into the substrate, masked by the thinned oxide strip 24c and the gate electrode 22a, to form lightly doped source/drain regions 26 of a second conductivity type within the substrate to either side of the gate electrode, which lightly doped regions are self-aligned to the gate electrode. The purpose of the lightly doped source/drain regions is to take up part of the voltage drop that normally occurs across the lightly doped channel in order to reduce hot electron effects as the gate length is reduced As shown in FIG. 2h, a nitride layer of approximate thickness 500–2000 Å is deposited onto the thinned oxide strip 24c and the exposed portions of the gate oxide layer 21 and then etched-back in order to form insulating gate sidewall spacers 27 on the gate oxide layer contiguous to either side of the gate electrode.

Figure 2I:
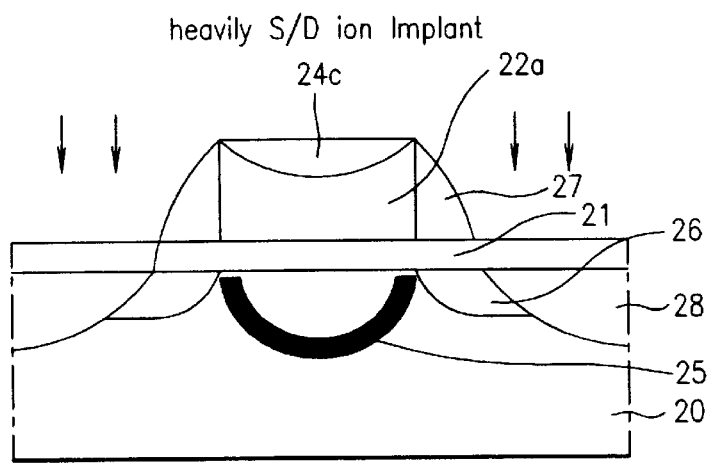

As shown in FIG. 2i dopants are implanted into the substrate, masked by the gate electrode 22a and the gate sidewall spacers 27 in order to form heavily doped source/drain regions 28 of the second conductivity type within the substrate to either side of the gate electrode, which heavily doped regions are self-aligned to the sidewall spacers contiguous to the gate electrode. B or $BF_2$ are typically implanted to form an NMOS device, As or P to form a PMOS device. The energy of ion implantation is adjusted according to the thickness of the gate electrode. The purpose of the heavily doped source/drain regions, which merge with the lightly doped source/drain regions below the sides of the sidewall spacers, is to provide source/drain regions of low bulk resistivity.

Figure 2J:
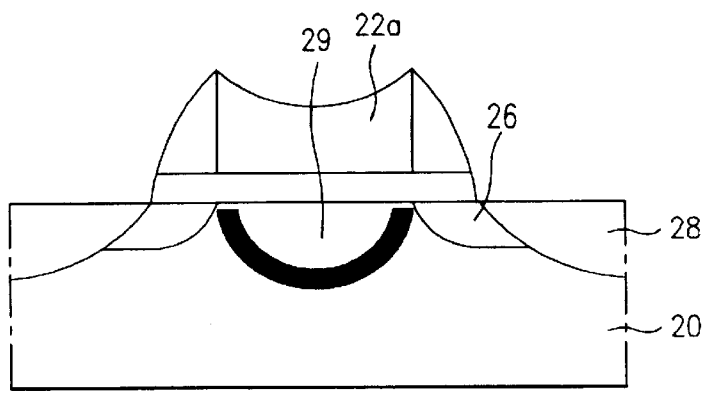

Fabrication of the short-channel NMOS device is completed by removal of the exposed surface of the gate oxide layer 21 and the thinned oxide strip 24c, as shown in FIG. 2j.

Second Embodiment

Figure 3A:
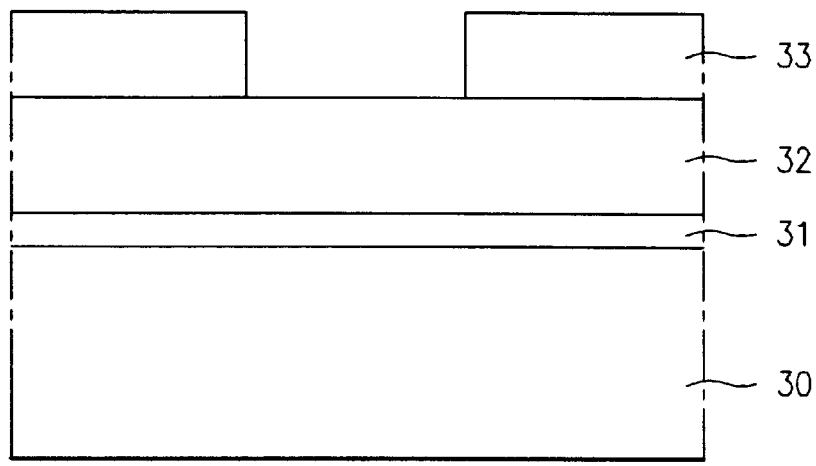
FIGS. 3a–3h are idealized cross-sectional views illustrating process steps of a method of fabricating a short-channel NMOS device according to a second embodiment of the present invention.

As shown in FIG. 3a, a polysilicon layer 32 of approximate thickness 1500–2500 Å is deposited over gate oxide layer 31 that has been grown to a thickness of about 40–100 Å on a silicon substrate 30 of a first conductivity type. A silicon nitride layer 33 of approximate thickness 500–2000 Å is formed on the polysilicon layer 32, then patterned by conventional photolithographic and etching processes to expose a strip of the polysilicon layer which will subsequently become the gate electrode.

Figure 3B:
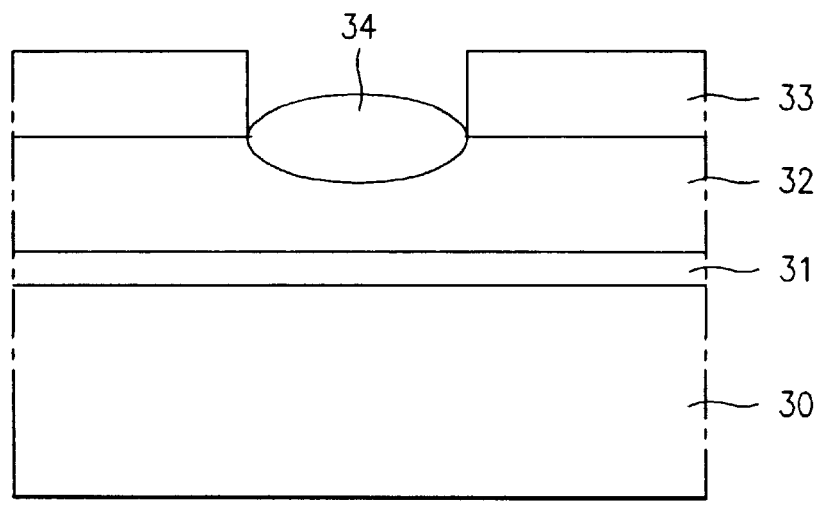

The exposed strip of polysilicon layer 32 is oxidized to form an oxide strip 34, as shown in FIG. 3b.

Figure 3C:
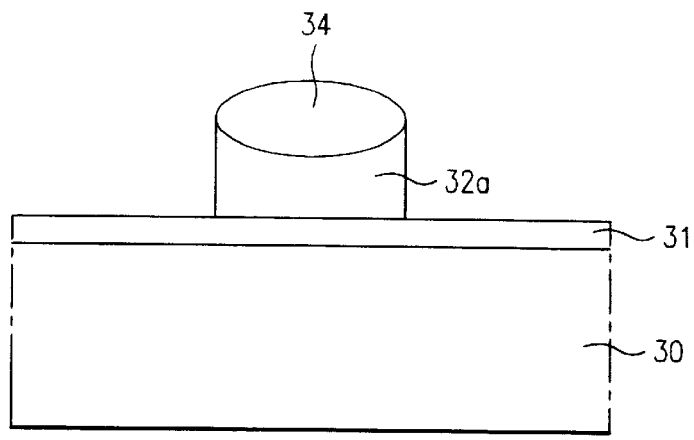

The remaining nitride layer 33 is removed and the polysilicon layer 32 is etched to form a polysilicon gate electrode 32a topped by the oxide strip 34, as shown in FIG. 3c. To ensure a high quality interface under what will become the gate sidewall spacers, it is important that the thermally grown gate oxide remain in place after the polysilicon gate etch This requires a polysilicon etch process with high selectivity to oxide, since the gate oxide is typically quite thin.

Figure 3D:
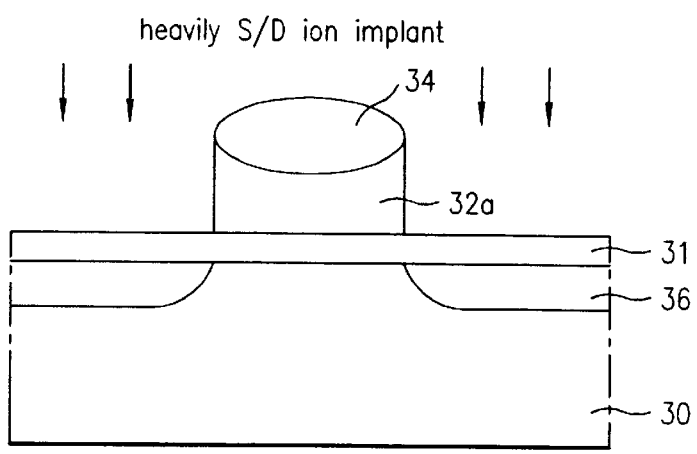

As shown in FIG. 3d, dopants are implanted into the substrate, masked by the gate electrode, in order to form lightly doped source/drain regions 36 of a second conductivity type within the substrate to either side of the gate electrode, which lightly doped regions are self-aligned to the gate electrode. The purpose of the lightly doped source/drain regions is to take up part of the voltage drop that normally occurs across the lightly doped channel in order to reduce hot electron effects as the gate length is reduced.

Figure 3E:
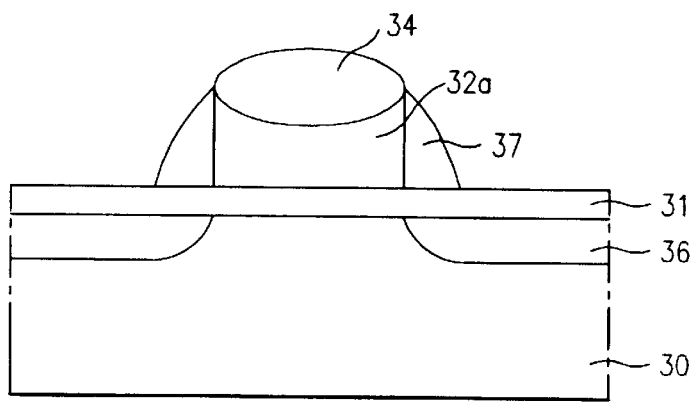

As shown in FIG. 3e, a silicon nitride layer of approximate thickness 500–2000 Å is deposited on all exposed surfaces and then etched-back to form insulating gate sidewall spacers 37 on the gate oxide contiguous to either side of the gate electrode.

Figure 3F:
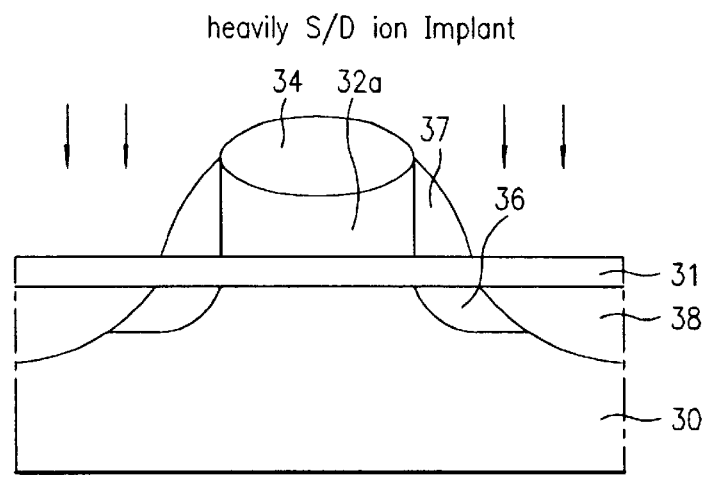

As shown in FIG. 3f dopants are implanted through the exposed surface of thin gate oxide 31 into the substrate, masked by the gate electrode and the sidewall spacers contiguous to it, in order to form heavily doped source and drain regions 38 of the second conductivity type within the substrate to either side of the gate electrode, which heavily doped regions are self-aligned to the sidewall spacers contiguous to the gate electrode. The purpose of the heavily doped source/drain regions, which merge with the lightly doped source/drain regions below the sides of the sidewall spacers, is to provide source/drain regions of low resistivity.

Figure 3G:
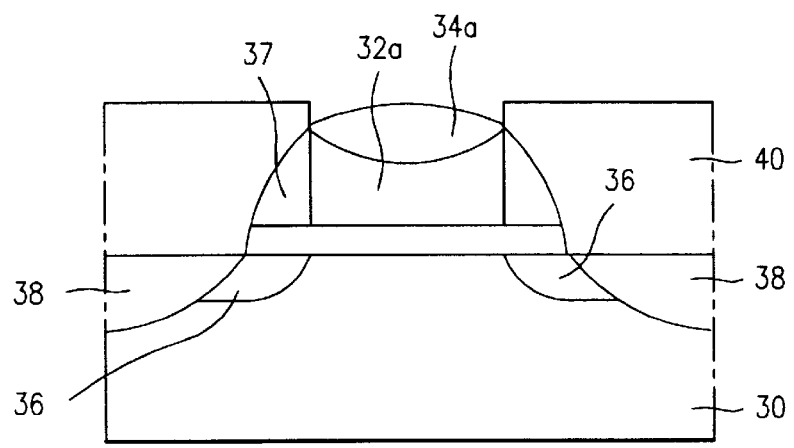

As shown in FIG. 3g, a silicon layer 40, at least as thick as the gate electrode, is either grown by epitaxy or deposited by chemical vapor deposition (CVD) on the substrate over the source/drain regions after the exposed portions of the gate oxide layer 31 have been removed. Since the oxide strip 34 is much thicker than the exposed gate oxide layer 31, the former is thinned, but not removed, by the process that completely removes the latter.

When the thinned oxide strip 34a is in turn removed from the gate electrode 32a, the resulting exposed surface of the gate electrode 32a has a depression characteristic of a silicon substrate that has been oxidized by means of a semirecessed LOCOS process. Although the curvature of a silicon surface that has been oxidized in this manner is evident only near the margins of the surface, the neighborhood of the sides of the gate here comprises a significant fraction of the gate due to the (short-channel) geometry of the device being fabricated. This departure from planarity occasioned by use of the semirecessed LOCOS oxidation process, normally a limitation of the process when applied to the fabrication of submicron devices, is used to advantage in the following process step.

Figure 3H:
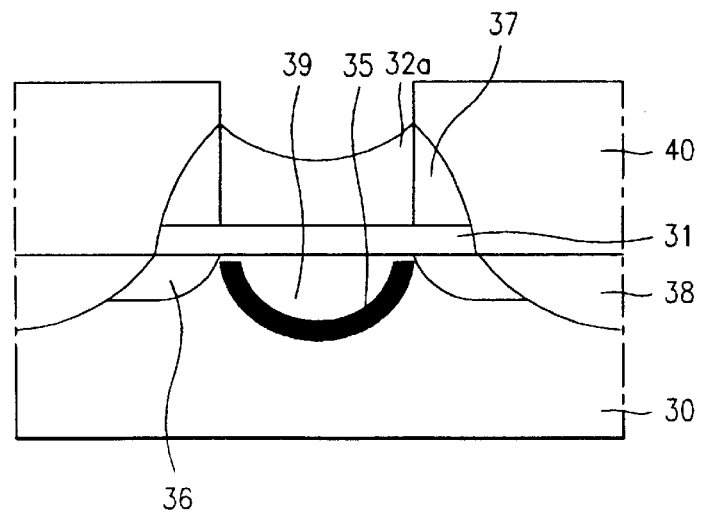

After the thinned oxide strip 34a has been removed from the gate electrode 32a, dopants are implanted into the channel region of the substrate, masked by the epitaxially-grown or CVD-deposited silicon layer 40, in order to form heavily doped channel region 35 below the gate electrode 32a, as shown in FIG. 3h. Due to the lateral variation in thickness of the gate electrode, the depth below the gate oxide-substrate interface of the peak dopant concentration under the gate electrode also varies laterally. Under the (relatively thick) sides of the gate electrode, close to the leading edges of the lightly-doped source/drain regions, the peak dopant concentrations occur closest to the gate oxide-substrate interface, typically at depths comparable to the depths of the lightly-doped source/drain junctions. Under the (relatively thin) middle region of the gate electrode, between the source and drain regions, the peak dopant concentration occurs furthest from the gate oxide-substrate interface, typically at a depth comparable to the depths of the bottoms of the heavily doped source/drain regions.

The doping profile of the channel region obtained by ion implantation through the gate electrode thus reflects the lateral variation in thickness across the gate electrode. The peak dopant concentration under the middle region of the gate electrode occurs further below the substrate-gate oxide interface than the peak dopant concentration under the sides of the gate electrode. For a long-channel MOS device, the peak dopant concentration profile approximates the pulse-shaped doping profile described in the above Discussion of Related Art. As the gate length is reduced, the sides of the gate electrode assume greater importance in determining the doping profile until the peak dopant concentration finally exhibits a concave-up profile, in which the depth of the peak dopant concentration below the gate oxide-substrate interface varies continuously from its relative minima under the sides of the gate electrode to its maximum under the middle region of the gate electrode.

The doping of the channel region is completed by formation of a uniformly lightly doped channel region 39 of the first conductivity type above the heavily doped channel region 35 by means onion implantation. Either B or BF$_2$ may be implanted to form the heavily doped channel region of an NMOS device, while either As or P may be implanted to form the heavily doped channel region of a PMOS device. The energy of ion implantation is adjusted according to the thickness of the gate electrode.

Third Embodiment

Figure 3I:
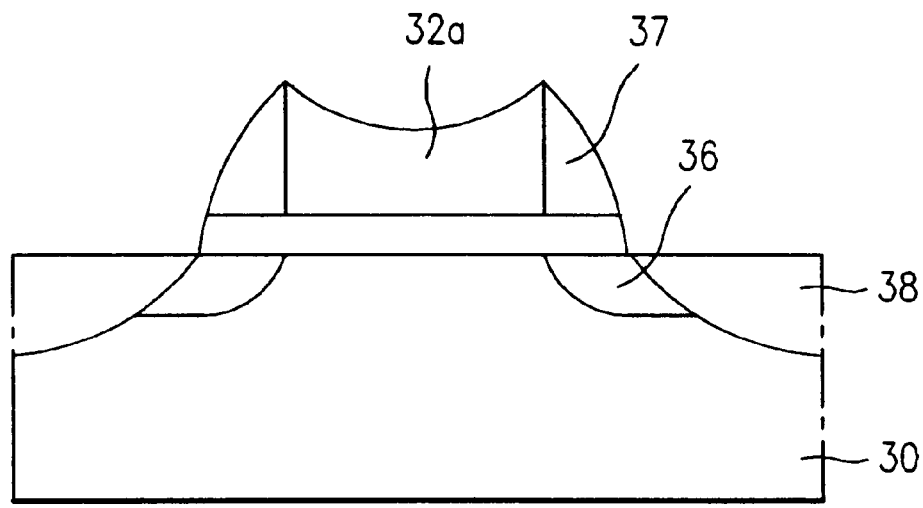
FIGS. 3i–3j are idealized cross-sectional views illustrating a modification of the process of the second embodiment.
Figure 3J:
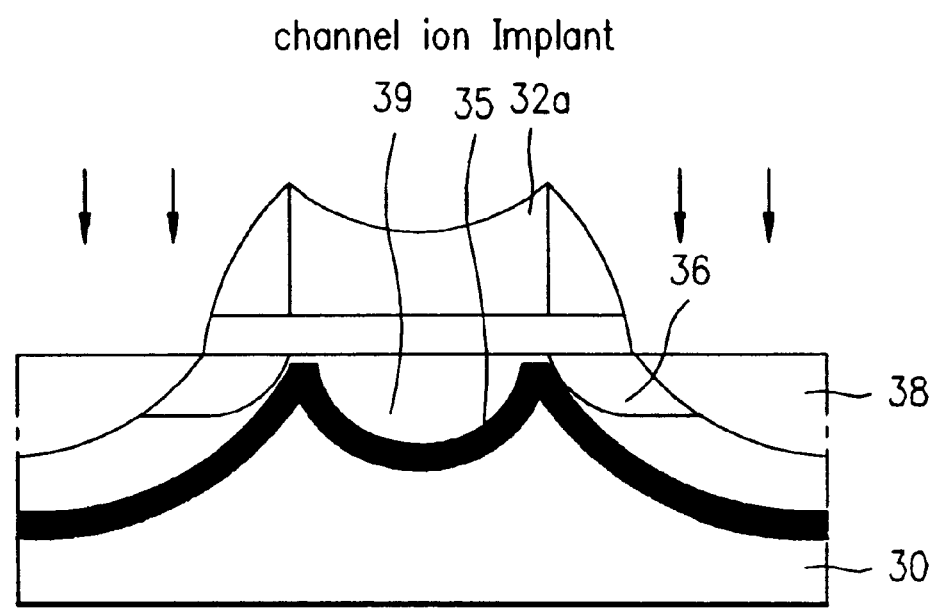

The process of the second embodiment may be easily modified to form a doping profile in the channel region which is a superposition of the novel doping profile of the present invention and a conventional halo-shaped doping profile. After formation of heavily doped source and drain regions by means of the process of the second embodiment (see FIG. 3f), exposed gate oxide layer 31 is removed, followed by thinned oxide strip 34a, as shown in FIG. 3i. As shown in FIG. 3j, dopants are implanted into the substrate, masked by the gate electrode and its contiguous sidewall spacers, to form a doping profile which is a composite of concave-up doping profile 35 and conventional halo-shaped doping profile 41 which bounds from below both the lightly doped and the heavily doped source/drain regions. The MOS device of the present invention exhibits several advantages over devices disclosed in the prior art. The heavily doped channel region under the edges of the gate electrode helps to suppress subthreshold currents near the gate oxide-substrate interface (i.e., current caused by drain-induced barrier lowering) but does not greatly increase the source-to-body and drain-to-body capacitances. The heavily doped channel region under the middle of the gate electrode helps to suppress subthreshold currents in the bulk substrate (i.e., punch—through) by reducing the lateral widening of the drain depletion region below the surface. Although the charge on the gate is increased by the heavily doped channel region far under the gate electrode, the lightly doped channel region immediately below the gate electrode effectively maintains a low threshold voltage.

The embodiments described above are intended to illustrate the claimed invention, but not to exhaustively delineate every detail of the invention as practiced. It will be apparent to those of ordinary skill in the art of MOS device fabrication that various modifications and variations of the method of the present invention may be made without departing from either the spirit or the scope of the invention. The present invention is thus intended to cover such modifications and variations provided they fall within the scope of the appended claims and their equivalents.

What is claimed is:

1. A method of fabricating a semiconductor device on a substrate of a first conductivity type, the method comprising the steps of:

forming a polysilicon layer over the substrate, the polysilicon layer having a depression in a first region that will subsequently be included in a gate electrode;

forming a doped channel region of the first conductivity type within the substrate, the doped channel region having a peak dopant concentration profile corresponding to the depression in the polysilicon layer;

etching the polysilicon layer to form a polysilicon gate electrode that includes the first region of the polysilicon layer, the gate electrode having a first side and a second side; and forming first doped source/drain regions of a second conductivity type within the substrate to either side of the gate electrode, the first doped source/drain regions self-aligned to the gate electrode, wherein the step of forming a polysilicon layer over the substrate includes the sub-steps of:

forming a first insulating layer on the substrate, the first insulating layer having an interface with the substrate;

depositing a polysilicon layer on the first insulating layer;

depositing a second insulating layer on the polysilicon layer;

etching the second insulating layer to expose a first region of the polysilicon layer that will subsequently be included in a gate electrode;

forming a third insulating layer on the first exposed region of the polysilicon layer, thereby forming a concave-up depression in the polysilicon layer; and removing the third insulating layer from the polysilicon layer.

2. The method according to claim 1, wherein the step of etching the polysilicon layer to form a polysilicon gate electrode that includes the first region of the polysilicon layer includes the sub-steps of forming a fourth insulating layer in the concave-up depression of the polysilicon layer;

etching the second insulating layer and the polysilicon layer, thereby exposing a region of the first insulating layer and forming a gate electrode having the concave-up depression in which the fourth insulating layer has been formed;

depositing a fifth insulating layer on the exposed region of the first insulating layer and on the fourth insulating layer; and etching the fifth insulating layer to form gate sidewall spacers on the first insulating layer, contiguous to either side of the gate electrode.

3. The method according to claim 2, further comprising the step of:

implanting dopants of the second conductivity type to form within the substrate to either side of the gate electrode second source and drain doped regions of the second conductivity type more heavily doped than the first source and drain doped regions, the more heavily doped source and drain regions self-aligned to the sidewall spacers contiguous to the gate electrode.

* * * * *